United States Patent [19]  
Burgess

[11] Patent Number: 4,642,160  
[45] Date of Patent: Feb. 10, 1987

[54] MULTILAYER CIRCUIT BOARD MANUFACTURING

[75] Inventor: Larry W. Burgess, Tigard, Oreg.

[73] Assignee: Interconnect Technology Inc., Beaverton, Oreg.

[21] Appl. No.: 764,497

[22] Filed: Aug. 12, 1985

[51] Int. Cl.$^4$ .............. C23F 1/02; B44C 1/22; C03C 15/00; B29C 17/08
[52] U.S. Cl. .................... 156/630; 29/852; 156/633; 156/634; 156/644; 156/652; 156/655; 156/656; 156/659.1; 156/668; 156/902; 427/97; 430/314; 430/318
[58] Field of Search .......... 29/852, 855, 874, 883–885; 156/630, 633, 634, 644, 652, 655, 656, 659.1, 668, 901, 902; 174/68.5; 427/96–98; 430/313–316, 318

[56] References Cited  
U.S. PATENT DOCUMENTS

| 4,030,190 | 6/1977 | Vorker | 29/852 |
| 4,211,603 | 7/1980 | Reed | 156/902 X |
| 4,566,186 | 1/1986 | Bauer et al. | 29/852 |

Primary Examiner—William A. Powell  
Attorney, Agent, or Firm—Dellett, Smith-Hill and Bedell

[57] ABSTRACT

A circuit board is manufactured from a core layer having a conductor run layer overlying the core layer on one side thereof, and a continuous layer of dielectric material overlying the conductor run layer, by forming a continuous outer layer of conductive material over the layer of dielectric material. Material of the continuous outer layer is removed at a predetermined location, and the dielectric material that is thus exposed is also removed so as to form an opening through which the conductor run layer is exposed. Conductive material is deposited into the opening to at least the level of the outer conductor layer, whereby the conductor run layer is connected to the outer layer of conductive material.

4 Claims, 9 Drawing Figures

MULTILAYER CIRCUIT BOARD MANUFACTURING

This invention relates to multilayer circuit boards and the fabrication thereof.

BACKGROUND OF THE INVENTION

In the conventional method of manufacturing a multilayer circuit board, several double-sided boards are laminated together with intervening layers of dielectric material. Each double-sided board comprises a core layer of epoxy-glass having copper foils laminated to its two opposite sides. The copper foils that will not be exposed at the exterior of the multilayer circuit board are patterned and selectively etched to define respective inner layers of conductor runs. The patterns are defined with reference to alignment holes that are drilled in the border area of the board. After etching of the inner layers, alignment pins are fitted through the alignment holes in each board to form a "book", there being a sheet of glass-reinforced epoxy material interposed between each two adjacent double-sided boards in the book, and the boards are laminated together under heat and pressure. In order to form interconnections between conductor runs that are in different layers, holes are drilled through the laminated assembly, exposing at the interior of the holes the conductor runs that are penetrated by the holes. The assembly is then electrolessly plated with copper, and copper deposited inside the holes interconnects the conductor runs that are penetrated by the holes and also connects those conductor runs to the outer (as yet unitary) copper foils. The outer foils are then masked and selectively etched to form outer layers of conductor runs.

There are numerous practical difficulties associated with this conventional method. First, the drill bit that is used to drill the holes through the laminated assembly must be sufficiently thick to be strong enough to penetrate the assembly, and this implies that in order to have a cost-effective production run the drill bits must be at least 13 to 20 mils (1 mil is 0.001 inch, or about 0.025 mm) in diameter. The lands of the inner conductor runs that are penetrated by the drill bit must be at least about 25 to 30 mils across in order to be sure that they will be penetrated, and conductor runs that are not to be penetrated must be at least about 25 to 30 mils from the nominal center of the hole in order to be sure that connections will not inadvertently be made to those conductor runs. The method used for aligning the patterns of conductor runs on the several double-sided boards that make up the multilayer board implies a possible error of as much as 5 mils in alignment of lands in different conductor run layers. Therefore, although commercially-available NC drilling machines are able to position a drill bit to within 1 mil of a desired position, other constraints make it impossible to take advantage of this capability, and in any event the size of the lands of circuit runs that are interconnected through drilled holes places a lower limit on the separation of the features of a circuit board manufactured by the conventional method.

In U.S. Pat. No. 4,211,603, two methods of manufacturing a multilayer circuit board are described. In accordance with the first method, the starting material is a double-sided circuit board having a core and two inner layers of conductor runs on the opposite face respectively of the core. Conductor runs of the two inner layers are selectively interconnected by plated through-holes in the board. The conductor run layers are covered with respective layers of dielectric material, while leaving the through-holes open and the plated interiors of the through-holes exposed. The board is then plated with a continuous layer of metal, and films of photoresist are applied over the two opposite faces of the board, covering the throughholes. The photoresist layers are selectively exposed and the unexposed areas of photoresist are removed, and the thus-exposed metal of the plated layer is removed by chemical etching. The remaining portions of the photoresist are then stripped from the board, leaving outer conductor run layers that are selectively interconnected through the plated through-holes.

In the second method described in the U.S. Pat. No. 4,211,603 the starting material is the same. Layers of dielectric material are screened onto the opposite sides of the board, overlying the inner conductor run layers but leaving selected portions of those layers, including the pads surrounding the through-holes, exposed. A continuous layer of copper is plated on the board, completely covering the screened layers of dielectric material, the exposed portions of the conductor run layers and the plated interiors of the through-holes. Films of dry photoresist are laminated to the opposite sides of the board and are exposed and developed, and the thus-exposed areas of the continuous layer of copper are removed. The exposed photoresist material is then stripped from the board. The portions of the continuous layer of copper that remain form outer conductor run layers that are connected to the inner conductor run layers at locations of the inner layers that were left exposed by the screened dielectric material. The methods described in U.S. Pat. No. 4,211,603 are not applicable to use with surface mount technology, because of the relatively poor adhesion of electrolessly-deposited copper to the screened dielectric material. Moreover, it is not normally possible to position the screen to better than 10 mils, and it is not possible to use screening to define features that are smaller than 20 mils, and therefore these methods are not applicable to high density, high precision circuit boards.

It has previously been proposed that a laser light source should be used to form vias in printed circuit boards. However, this proposal has not reached commercial application because the energy needed to vaporize the dielectric material, i. e. epoxy glass, is so variable that it has not been possible to produce reliable, clean and smooth vias.

SUMMARY OF THE INVENTION

In accordance with a preferred embodiment of the invention, a circuit board is fabricated from a board comprising a core layer, an inner conductor run layer overlying the core layer on one side thereof, and a continuous layer of dielectric material overlying the conductor run layer. A continuous outer layer of conductive material is formed over the layer of dielectric material, and material of the continuous layer of conductive material is locally removed. Dielectric material exposed by local removal of the outer layer of conductive material is removed, so as to expose conductive material of the conductor run layer without removing material of that layer. Conductive material is deposited into the opening thus formed in the layer of dielectric material and at least partially over the outer layer of conductive material, whereby the inner conductor run layer is electrically connected to the outer layer of conductive material. Material of the outer layer of conductive material is selectively removed to define conductor runs.

Preferably, the local removal of the outer layer of conductive material is accomplished by selective etching, and the dielectric material is removed by vaporization. If the inner conductor run layer is formed from a copper foil that has been selectively etched to define the conductor runs of the conductor run layer, the vaporization of the dielectric material is preferably accomplished by use of a narrow laser beam directed onto the dielectric material through the opening formed by local removal of the conductive material of the outer layer. Preferably, the conductive material that is deposited into the opening in the layer of dielectric material is copper, and the copper is deposited electrolessly.

BRIEF DESCRIPTION OF THE DRAWINGS

For a better understanding of the invention, and to show how the same may be carried into effect, reference will now be made, by way of example, to the accompanying drawings in which.

Figure 1:
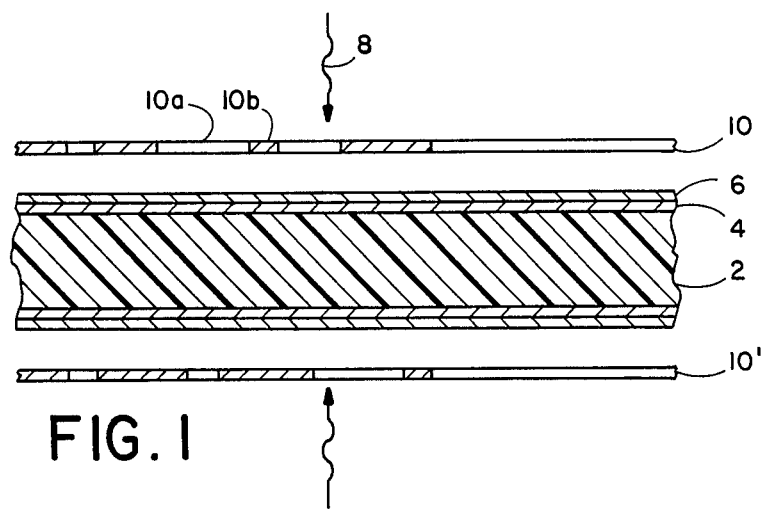
FIGS. 1, 2 and 4 to 9 are partial sectional views of a circuit board illustrating respective stages in the manufacture thereof.

The following description is concerned with the fabrication of a circuit board. The operations that are performed on the two sides of the board are essentially identical. Therefore, in order to simplify the explanation and avoid confusion, the description will only concern itself with one side of the board except when discussion of both sides is necessary. In addition, relative dimensions have been distorted in the drawings for the sake of clarity.

DETAILED DESCRIPTION

The board shown in FIG. 1 of the drawings comprises a core 2 of conventional epoxy-glass material. Other materials of adequate physical and dielectric strength may, however, be used. Tooling holes are drilled in marginal areas of the core, and alignment pins are fitted in the holes. The core has a continuous foil 4 of copper laminated to its upper main face. Typically, the copper foil 4 is 0.18 to 1.4 mils thick. It will be understood by those skilled in the art that a copper foil that is less than about 0.7 mils thick requires a carrier, which is typically a foil of aluminum that is removed by chemical action. A dry film 6 of photoresist is placed over the foil 4 and is adhered to the foil by application of heat and slight pressure. The film 6 is exposed to ultraviolet light or other actinic radiation 8 through a mask 10 having transparent areas 10a and opaque areas 10b. The mask 10 is fitted over the alignment pins, so that the features of the mask are positioned relative to features of a mask 10' at the opposite side of the board within about 1 to 3 mils. The areas of the photoresist film 6 that are exposed to light through the mask 10 are polymerized, and treatment with a developer for the resist dissolves the unexposed areas of the photoresist, exposing portions of the underlying foil 4. By conventional selective etching, the copper of the exposed areas is removed, and the remaining photoresist is chemically stripped. The copper remaining on the core 2 forms a patterned layer 4' having features that correspond with the transparent areas 10a of the mask 10. The pattern of copper comprises conductor runs 12 and, along margin areas of the core, registration targets 14. Using conventional technology, features of the pattern can be positioned relative to one another to less than 0.5 mil, and accordingly the registration targets are positioned relative to the features of the conductor runs of the layer 4' to within 0.5 mil.

At least one bonding sheet 16 is placed over the patterned layer 4', and a copper foil 18 is placed over the bonding sheet and the resulting assembly is laminated together under heat and pressure. As in the case of the foil 4, the foil 18 is typically 0.18 to 1.4 mils thick, and if the copper foil is less than 0.7 mils thick it would be supported by a carrier foil of aluminum, and the composite copper/aluminum foil would be oriented with the copper foil towards the bonding sheet. The bonding sheet is made of organic material, e.g. partially cured epoxy, and is essentially homogeneous. Consequently, the sheet 16 does not contain any inorganic material such as glass fibers. The number of bonding sheets that are used depends on the thickness of each sheet and the desired thickness of the adhesive layer 16', which may be, e.g., 1 to 6 mils. On application of heat and pressure, the sheet 16 forms an adhesive layer 16' that secures the foil 18 to the patterned layer 4' and to areas of the core 2 that are exposed by the layer 4'. The copper foil 18 is pretreated, e.g. by oxidation, to roughen its surface and thereby promote adhesion to the core through the layer 16'. The copper foil does not cover the entire area of the patterned layer 4', but leaves the registration targets 14 exposed. Alternatively, if the foil 18 initially covers the targets 14, part of the foil may be removed by etching so as to expose the targets. The sheet 16 is sufficiently thin to enable the registration targets to be seen through the layer 16'. Alternatively, the sheet 16 may be sized to leave the targets 14 exposed, but this is not entirely satisfactory since the material of the sheet may flow under heat and pressure and cover the targets 14. It is therefore preferred that the material of the sheet 16 and the thickness of the sheet be selected so that the patterns can be viewed through the layer 16'.

If an aluminum carrier foil was used in application of the copper foil 18, the aluminum is removed by a caustic etch. A layer 20 of photoresist is deposited over the foil 18, and a mask 22 is positioned over the layer 20. The mask 22 has transparent portions 22a and opaque portions 22b and is positioned by fitting it over the alignment pins. The positions of the opaque portions 22b of the mask 22 correspond with locations at which it is desired to make contact with the conductor runs 12 of the layer 4'. The photoresist layer 20 is exposed to actinic radiation 26 through the mask 22, and the areas of the layer 20 that are not masked by the opaque features 22b are polymerized. The unexposed resist material is removed using a developer, thus exposing the underlying areas of the foil 18. By selective etching, the copper that is thus exposed is removed, forming apertures 28, and the remaining portions of the layer 20 are chemically stripped from the foil 18. It will be appreciated that the apertures 28 in the foil 18 are positioned relative to the features of the conductor runs 12 to within about 1 to 3 mils.

Figure 2:
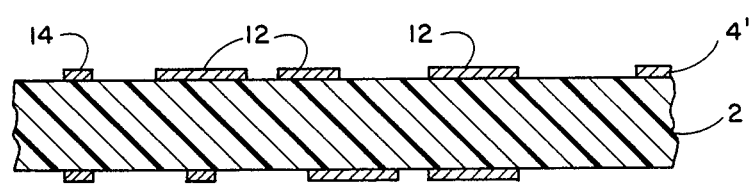
Figure 3:
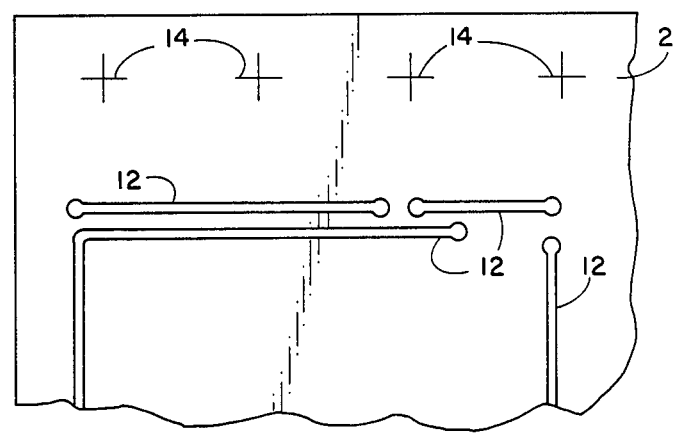
FIG. 3 is a partial plan view of the board at the stage shown in FIG. 2.
Figure 4:
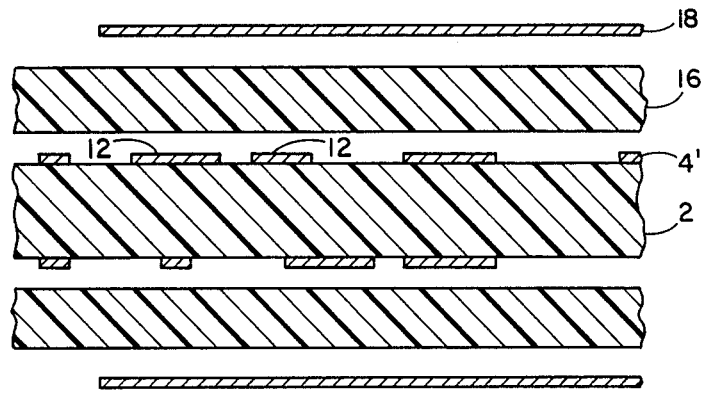
Figure 5:
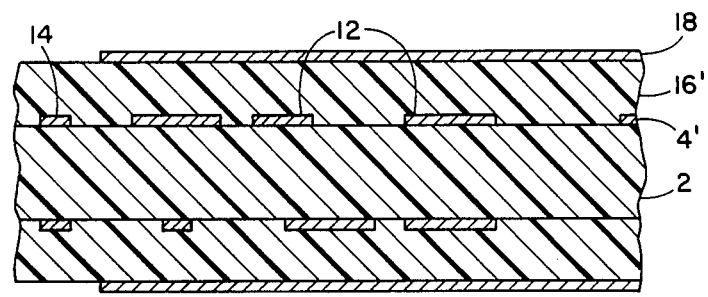
Figure 6:
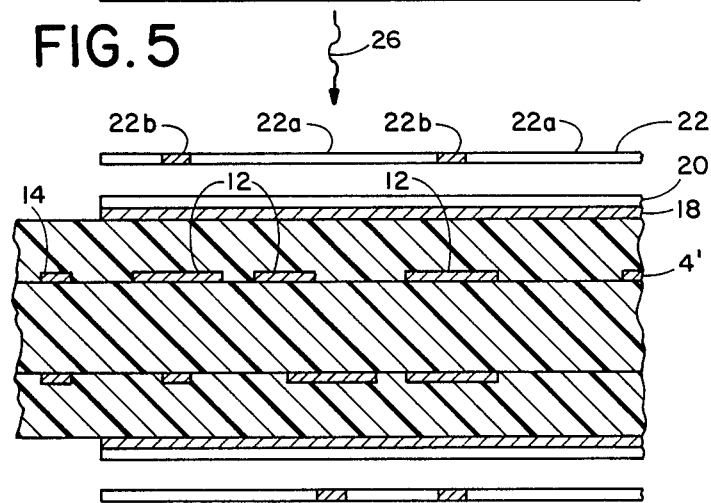
Figure 7:
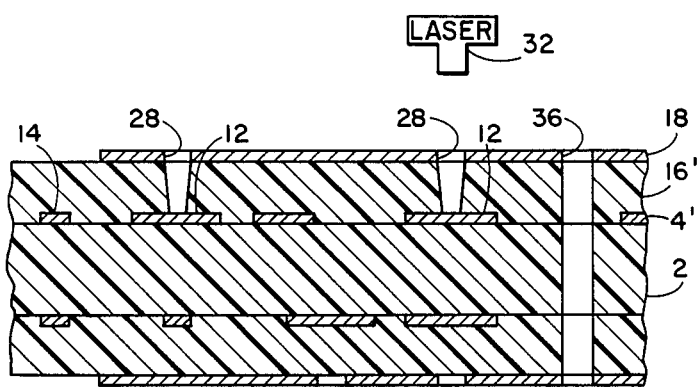
Figure 8:
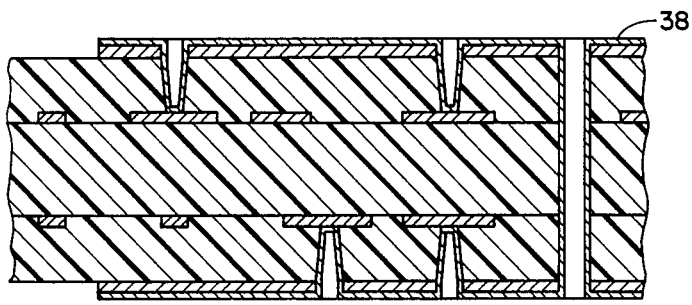
Figure 9:
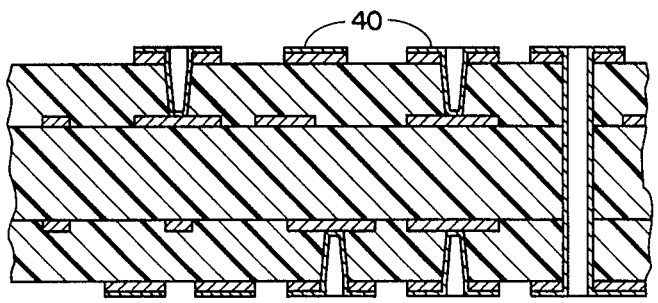

A laser light source 32 is positioned over the board and, by through-the-lens viewing, is aligned with one of the targets 14. The source is then moved under computer control to direct a beam of laser light successively through each of the apertures 28. The axis of the beam is maintained perpendicular to the plane of the upper surface of the foil 18. When the laser light source 32 is energized, it directs a high-intensity light beam through the aperture 28 and onto the material of the layer 16'. The heat generated in the layer 16' is sufficient to bring about local vaporization of the epoxy material, removing the epoxy material to provide a blind via exposing one of the runs 12 of the patterned layer 4'. The energy of the beam provided by the laser light source 32 can set at such a level that it will not result in generation of sufficient heat to damage the conductor run 12. Holes 36 are drilled through the board to provide through vias at locations at which it is desired to provide connections between the foils 18 on opposite sides of the core. After vaporization of the epoxy material and drilling of the holes 36, the interiors of the vias that thus formed are cleaned, e.g. chemically or by use of a vapor hone, and a layer 38 of copper is electrolessly deposited over the entire board. The layer 38 establishes electrical connection between the foil 18 and the conductor runs 12 exposed by the blind vias, and between the two foils 18. By use of techniques similar to those described with reference to FIGS. 1 and 2, the foil 18 and the layer 38 are etched to define a second patterned layer including conductor runs 40.

The operation described with reference to FIGS. 4 to 9 can then be repeated, burying the interconnect formed by the layer 38, establishing interconnects between the conductor runs 40 and a foil of copper that overlies the conductor runs 40, and defining a third layer of conductor runs in the copper foil.

After all alignment operations have been performed, the margins of the board, with the targets 14 and the tooling holes, may be removed.

By laminating the foil 18 to the board using the bonding sheet 16, superior adhesion is obtained between the conductor run 40 and the layer 16. This provides for a more versatile, durable and reliable circuit board that is similar in adhesion to boards manufactured by conventional lamination methods and is superior in adhesion to boards manufactured by additive or semi-additive plating methods.

It will be appreciated that the invention is not restricted to the particular method that has been described with reference to the drawings, and that variations may be made therein without departing from the scope of the invention as defined in the appended claims, and equivalents thereof. For example, other methods of locally removing the material of the layer 16' may be employed. Moreover, the invention is not restricted to the particular materials that have been described.

I claim:

1. A method of manufacturing a circuit board, comprising forming a conductor run layer on one face of a core layer, depositing a layer of dielectric material over the conductor run layer, depositing an outer layer of conductive material over the layer of dielectric material, locally removing material of the outer layer so as to expose the dielectric material, removing the exposed dielectric material so as to form an opening through which the conductor run layer is exposed, and depositing conductive material into said opening so as to establish electrical connection between the conductor run layer and the outer layer of conductive material.

2. A method according to claim 1, wherein the conductor run layer is formed by laminating a foil of conductive material to the core layer and selectively etching the foil of conductive material to define the conductor runs of the conductor run layer.

3. A method according to claim 1, wherein the layer of dielectric material is deposited as a unitary sheet over the conductor run layer and the outer layer of conductive material is deposited as a unitary sheet of conductive material over the unitary sheet of dielectric material, and the unitary sheets of dielectric material and conductive material are laminated to the core under heat and pressure.

4. A method according to claim 1, wherein the conductive material is deposited into said opening by electroless deposition of a layer of conductive material over the entire surface of the outer layer of conductive material, and the method further comprises selectively etching the electrolessly deposited material and the outer layer of conductive material to define an outer conductor run layer.

* * * * *